(12) United States Patent
de Witte et al.

(10) Patent No.: US 10,431,476 B2
(45) Date of Patent: Oct. 1, 2019

(54) METHOD OF MAKING A PLURALITY OF PACKAGED SEMICONDUCTOR DEVICES

(71) Applicant: NXP B.V., Eindhoven (NL)

(72) Inventors: Jetse de Witte, Nijmegen (NL); Antonius Hendrikus Jozef Kamphuis, Lent (NL); Jan Gulpen, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/935,187

(22) Filed: Mar. 26, 2018

(65) Prior Publication Data
US 2018/0301353 A1 Oct. 18, 2018

(30) Foreign Application Priority Data

Apr. 12, 2017 (EP) .................................. 17166282

(51) Int. Cl.
*H01L 21/56* (2006.01)
*H01L 21/48* (2006.01)
(Continued)

(52) U.S. Cl.
CPC ........ *H01L 21/561* (2013.01); *G01R 31/2886* (2013.01); *H01L 21/4825* (2013.01); *H01L 21/56* (2013.01); *H01L 21/565* (2013.01); *H01L 21/568* (2013.01); *H01L 21/6835* (2013.01); *H01L 21/6836* (2013.01); *H01L 21/78* (2013.01); *H01L 22/14* (2013.01); *H01L 23/3114* (2013.01); *H01L 23/4952* (2013.01); *H01L 23/49503* (2013.01);
(Continued)

(58) Field of Classification Search
CPC ............ G01R 31/2884; G01R 1/06711; H01L 21/4832
See application file for complete search history.

(56) References Cited

U.S. PATENT DOCUMENTS 5,886,362 A * 3/1999 Millican ................. H01L 22/20
257/48
6,399,415 B1 * 6/2002 Bayan .................. H01L 23/3107
257/692

(Continued)

FOREIGN PATENT DOCUMENTS

WO WO 20101/24179 A2 10/2010

*Primary Examiner* — Charles D Garber
*Assistant Examiner* — Alia Sabur

(57) ABSTRACT

A method of making a plurality of packaged semiconductor devices. The method includes providing a carrier blank having a die receiving surface and an underside. The method also includes mounting a plurality of semiconductor dies on the die receiving surface, wherein the dies extend to a first height above the die receiving surface. The method further includes depositing an encapsulant on the die receiving surface, wherein an upper surface of the encapsulant is located above said first height. The method also includes singulating to form the plurality of packaged semiconductor devices by sawing into the underside, through the carrier blank and partially through the encapsulant to a depth intermediate the first height and the upper surface, wherein said sawing separates the carrier blank into a plurality of carriers, and removing encapsulant from the upper surface of the encapsulant at least until said saw depth is reached.

12 Claims, 3 Drawing Sheets

(51) Int. Cl.
  *H01L 21/78* (2006.01)
  *H01L 21/683* (2006.01)
  *H01L 23/31* (2006.01)
  *H01L 23/495* (2006.01)
  *G01R 31/28* (2006.01)
  *H01L 21/66* (2006.01)

(52) U.S. Cl.
  CPC .... *H01L 23/49541* (2013.01); *H01L 23/3107* (2013.01); *H01L 2221/68327* (2013.01); *H01L 2221/68331* (2013.01); *H01L 2224/16245* (2013.01); *H01L 2224/48091* (2013.01); *H01L 2224/48247* (2013.01); *H01L 2224/73265* (2013.01); *H01L 2224/92247* (2013.01); *H01L 2224/97* (2013.01)

(56) References Cited

U.S. PATENT DOCUMENTS

| | | |
|---|---|---|
| 8,753,950 B2 | 6/2014 | Yun et al. |
| 9,165,831 B2 | 10/2015 | Daubenspeck et al. |
| 9,798,228 B2 | 10/2017 | Cobussen et al. |
| 2005/0287709 A1* | 12/2005 | Lee .................. H01L 21/56 438/122 |
| 2009/0087953 A1* | 4/2009 | Lin .................. H01L 21/4828 438/123 |
| 2012/0040510 A1 | 2/2012 | Yoo |
| 2013/0127043 A1* | 5/2013 | Poddar .................. H01L 24/19 257/737 |
| 2014/0057411 A1 | 2/2014 | Hoang et al. |
| 2015/0001698 A1 | 1/2015 | Jaurigue et al. |
| 2016/0118299 A1 | 4/2016 | Yang |
| 2016/0322273 A1 | 11/2016 | Wu et al. |

* cited by examiner

METHOD OF MAKING A PLURALITY OF PACKAGED SEMICONDUCTOR DEVICES

CROSS-REFERENCE TO RELATED APPLICATIONS

This application claims the priority under 35 U.S.C. § 119 of European patent application no. 17166282.8, filed Apr. 12, 2017 the contents of which are incorporated by reference herein.

BACKGROUND

The present specification relates to a method of manufacturing a plurality of packaged semiconductor devices. The present specification also relates to a plurality of packaged semiconductor devices made according to the method.

Because the packages of semiconductor devices are getting smaller and smaller, testing on individual products becomes ever more difficult. The testing of the products requires good stability and rigidity, as the probe needles used in the test are required to stay in good contact with the leads. Furthermore, co-planarity is important and the fact that each products should be handled one at a time makes individual test cost inefficient.

Besides the issues with testing, also the package thickness is of concern with current molding techniques. The molding of thin mold-caps has to be performed with expensive molding equipment (such as compression molding equipment). This process has large tolerances in terms of the thickness of the encapsulant. Because of this, testing on individual products as mentioned above can risk causing package cracks.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a method of making a plurality of packaged semiconductor devices, the method comprising:

providing a carrier blank having a die receiving surface and an underside;

mounting a plurality of semiconductor dies on the die receiving surface of the carrier blank, wherein the dies extend to a first height above the die receiving surface;

depositing an encapsulant on the die receiving surface, wherein an upper surface of the encapsulant is located above said first height, whereby the encapsulant covers the plurality of semiconductor dies; and singulating the carrier blank and encapsulant to form the plurality of packaged semiconductor devices by:

sawing into the underside of the carrier blank to saw through the carrier blank and saw partially through the encapsulant to a saw depth intermediate the first height and the upper surface of the encapsulant, wherein said sawing separates the carrier blank into a plurality of carriers, each carrier having an underside corresponding to the underside of the carrier blank and a die receiving surface corresponding to the die receiving surface of the carrier blank, wherein the die receiving surface of each carrier has at least one of said semiconductor dies mounted thereon; and removing encapsulant from upper surface of the encapsulant at least until said saw depth is reached.

By singulating according to the two stage process including sawing into the underside of the carrier blank and removing encapsulant from upper surface of the encapsulant, the encapsulant may be used to hold the semiconductor packages together during one or more other manufacturing steps (e.g. testing steps and/or solder reflow). For instance, these other steps may be performed after the carriers have been separated from each other by the sawing, but before the encapsulant is removed from the upper surface. This means that these other manufacturing steps may be performed while the encapsulant is still relatively thick (compared to the final packaged device). Because of this, the risks associated with potential damage to the device (e.g. cracking of the device by probe needles during testing) may be reduced. Furthermore, by selecting the saw depth and the amount of encapsulant that is removed from upper surface of the encapsulant, the thickness of the encapsulant in the final package can conveniently be selected.

The method may include contacting an electrical probe (e.g. probe needle(s)) to the underside of at least some of the carriers to test the packaged semiconductor devices. The contacting an electrical probe to the underside of at least some of the carriers may be performed after said sawing and before said removing encapsulant from upper surface of the encapsulant. In this way, the testing can be performed while the encapsulant still holds the packages together, conveniently providing mechanical stability for the packages during the testing.

The method may include performing solder reflow. The solder reflow may be performed before encapsulant is removed from the upper surface thereof, so that the encapsulant may hold the packages together during the solder reflow process.

The solder reflow may be performed after said testing the packaged semiconductor devices. The method may further include contacting an electrical probe to the underside of at least some of the carriers to re-test the packaged semiconductor devices after said solder reflow is performed. The re-testing the packaged semiconductor devices may be performed before said removing encapsulant from upper surface of the encapsulant, again conveniently allowing the packages to be held in position while the re-testing is performed.

The method may include using wire bonding electrically to connect each semiconductor die to the carrier blank prior to depositing the encapsulant on the die receiving surface.

After the encapsulant has been deposited on the die receiving surface, the encapsulant may extend to a greater height above the die receiving surface than the bond wires, so that the encapsulant covers the bond wires.

After said removing encapsulant from upper surface of the encapsulant, the encapsulant still extends to a greater height above the die receiving surface than the bond wires, so that the encapsulant still covers the bond wires.

Each semiconductor die may have a major surface having one or more electrical connections provided thereon. Mounting the semiconductor dies on the die receiving surface may include attaching the major surface of each die to the die receiving surface by electrically connecting the electrical connections on the major surface of each die to the die receiving surface. In this way, embodiments of this disclosure may be compatible with flip-chip manufacturing processes.

Prior to the removing encapsulant from upper surface of the encapsulant, the method may include mounting the undersides of the carriers on a grinding tape. This can allow the semiconductor packages to be held in place during and after the removal of the encapsulant from upper surface of the encapsulant.

As used herein, the term sawing may include any of the following: blade sawing, plasma sawing, ablation sawing, or laser sawing.

According to another aspect of the present disclosure, there is provided a packaged semiconductor device manufactured by the method set out above.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

FIGS. 1 to 4 show a number of initial steps in the manufacture of a plurality of packaged semiconductor devices, each comprising a wire bonded package in accordance with an embodiment of this disclosure.

Figure 1:
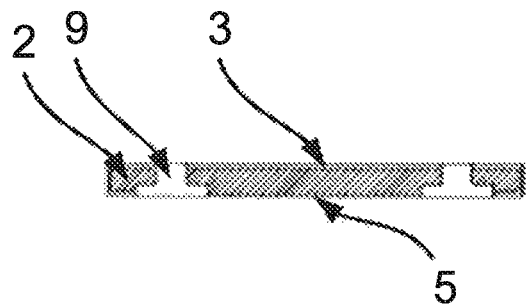
FIGS. 1 to 4 show a number of initial steps in the manufacture of a plurality of packaged semiconductor devices, each comprising a wire bonded package in accordance with an embodiment of this disclosure.

In a first step shown in FIG. 1, the method includes providing a carrier blank 2. As will be described subsequently in relation to FIGS. 7 to 9, the carrier blank 2 may be singulated to form the plurality of packaged semiconductor devices. In FIGS. 1 to 4 (and FIGS. 5 to 7 also), only the part of the carrier blank 2 that will subsequently form a carrier in one of the packages after singulation is shown, so that a detailed view of the features of each subsequently formed package may be provided. It will be appreciated that the arrangements shown in FIGS. 1 to 4 (and FIGS. 5 to 7 also) may be repeated across the larger carrier blank 2 and subsequently singulated, for forming a large number of packages, allowing the manufacturing method to be scaled easily.

The carrier of the finished packaged devices may, for example, comprise a lead frame as is known in the art of semiconductor packaging. The lead frame may comprise a metallic member for mounting a semiconductor die thereon and for making appropriate electrical connections to the semiconductor die. In another example, the carrier of the finished packaged devices may comprise a dielectric part (e.g. substrate) including one or more metallic surface layers for forming the connections to the semiconductor die and for forming external connections of the final package device. In some examples, metal filled vias may extend through the dielectric part, for connecting together the external connections of the package and any electrical connections located on a major surface of the semiconductor die. It will be appreciated that, prior to singulation of the packages as described below, the carrier blank 2 may comprise a monolithic work piece including a plurality of parts arranged in an array (e.g. linear strip, or in a grid), each part corresponding to the final carrier of the packaged device.

The carrier blank 2 includes a die receiving surface 3 and an underside 5. The die receiving surface 3 and/or the underside 5 may be substantially planar. The underside 5 of the carrier blank 2 is a surface of the carrier blank 2 opposite the die receiving surface 3. In some examples, the carrier blank 2 includes separate parts which are spaced from each other by one or more openings 9. The openings 9 may, for example, be filled with dielectric such as the encapsulant 20 to be described below in more detail. The openings 9 can serve to electrically isolate different parts of the carrier blank 2 from each other, in order to allow correct routing of the electrical connections from the semiconductor die that is to be mounted on the blank 2 and the external contacts of the final package device.

Figure 2:
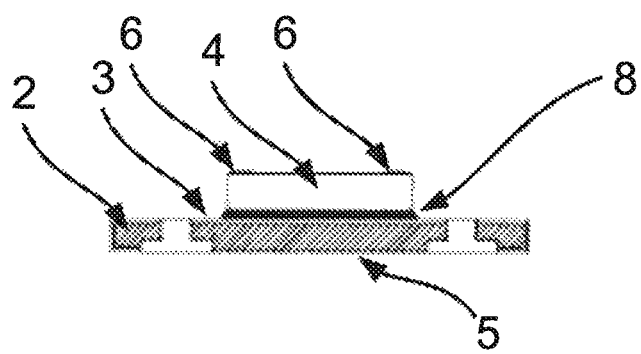

In a next step shown in FIG. 2, a plurality of semiconductor dies 4 may be mounted on the carrier blank 2. In particular, the dies 4 may be mounted on the die receiving surface 3. As noted above, FIGS. 1 to 4 only show the part of the overall carrier blank 2 corresponding to a single one of the final package semiconductor devices and therefore only a single die 4 is shown in FIG. 2. Note though that it is also envisaged that in some examples more than one die 4 may be provided in a single final package device. In such cases, the dies of each package may be provided side-by-side on the die receiving surface of the carrier and/or may be stacked on the die receiving surface.

Figure 4:
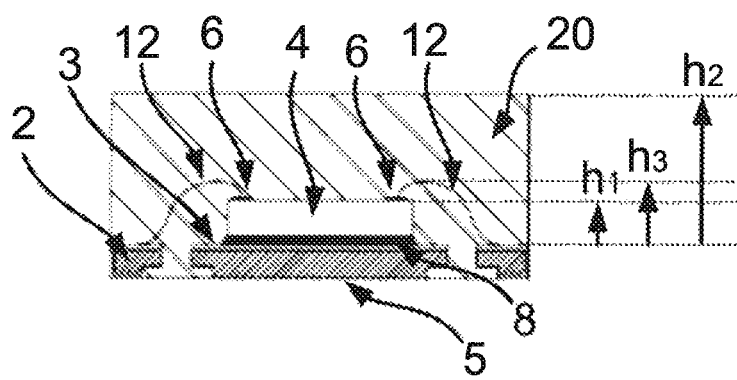
Figure 5:
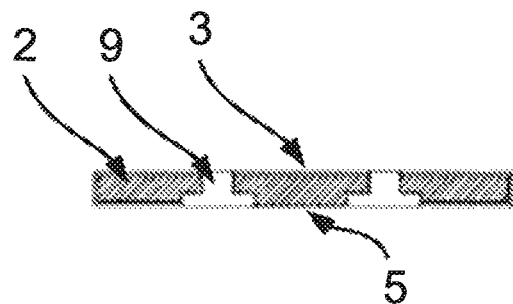
FIGS. 5 to 7 show a number of initial steps in the manufacture of a plurality of packaged semiconductor devices, each comprising a flip chip package in accordance with another embodiment of this disclosure.
Figure 6:
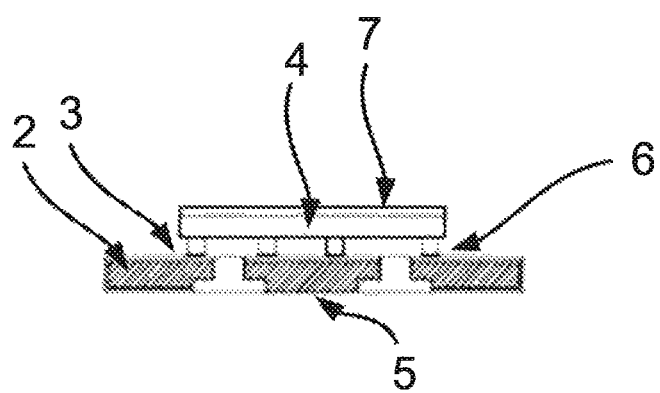
Figure 7:
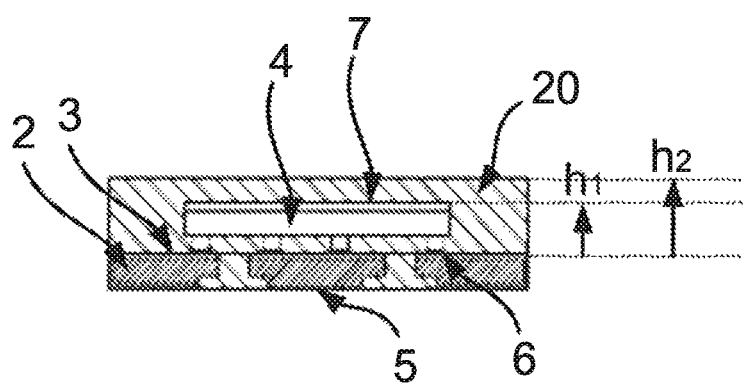

The semiconductor die 4 may, for example, comprise silicon. The mounting of the semiconductor die(s) of each package on the carrier may be implemented in a number of ways. For instance, this may include die bonding and wire bonding (an example of this is shown in FIGS. 1-4), or by using bumped dies and a flip chip approach (an example of this is shown in FIGS. 5-7).

In the present example, the semiconductor die 4 has a major surface, which in the present example includes one or more electrical contacts such as bond pads 6. The major surface comprising the bond pads 6 faces away from the die receiving surface 3 in this embodiment, and the underside of the die 4 is attached using, for example, an adhesive 8 to the die receiving surface 3.

Figure 3:
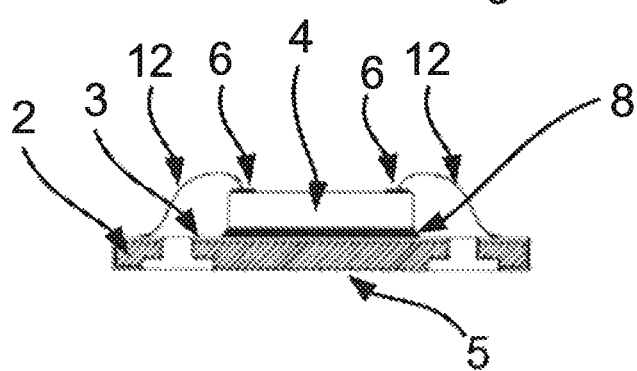

In a next stage shown in FIG. 3, the bond pads 6 of the semiconductor die 4 are attached to one more electrical connections of the carrier blank 2 using bond wires 12. In particular, it is envisaged that the bond wires 12 may connect the bond pads 6 to electrical connections located on the die receiving surface 3 of the carrier blank 2.

In a next step, an encapsulant 20 is deposited on the die receiving surface 3 of the carrier blank 2. Only the part of the encapsulant 20 corresponding to one of the final package devices is shown in FIG. 4, for the reasons already mentioned above. As can be seen in FIG. 4, the encapsulant 20 in this example completely covers the semiconductor die 4, the die receiving surface 3 and the bond wires 12. In particular, in the present example, the encapsulant 20 extends to a height $h_2$ above the die receiving surface 3 of the carrier blank 2, the semiconductor die 4 extends to a height $h_1$ above the die receiving surface 3 and the bond wires extend to a height $h_3$ above the die receiving surface 3, where $h_2$ is higher than $h_3$ and $h_1$.

FIGS. 1 to 4 correspond to example embodiments in which wire bonding is used to connect a semiconductor 4 to the carrier. However, embodiments of this disclosure are also compatible with flip chip technology. An example of this is described now in relation to FIGS. 5 to 7.

FIGS. 5 to 7 show a number of initial steps in the manufacture of a plurality of packaged semiconductor devices, each comprising a flip chip package in accordance with another embodiment of this disclosure.

In FIG. 5, there is provided a carrier blank 2, which may be similar to that described above in relation to FIG. 1.

In a next step shown in FIG. 6, a semiconductor die 4 is mounted on a die receiving surface 3 of the carrier blank 2. Again, the semiconductor die 4 may be for example, comprise silicon. The semiconductor die 4 includes electrical connections 6 located on a major surface thereof. To mount the semiconductor die 4 on the carrier blank 2, the semiconductor die 4 may be flipped over so that the major surface faces down towards the die receiving surface 3 of the carrier blank 2. The electrical connections 6 formed on the major surface of the semiconductor die 4 may then be electrically connected to corresponding contacts provided on the die receiving surface 3. In some examples, the connections between the die 4 and the carrier blank 2 may comprise one or more solder balls, although other types of connection may also be used. Note that when the semiconductor die 4 is mounted on the carrier blank 2 as shown in FIG. 6, the underside of the semiconductor die 4 faces away from the die receiving surface 3. As shown in FIG. 6, in some examples, an underside of the semiconductor die 4 may be provided with a protective layer 7.

In a next step (FIG. 7), an encapsulant 20 may be deposited on the die receiving surface 3. In common with the example described above in relation to FIG. 4, the upper surface of the encapsulant 20 is located at a height $h_2$ above the die receiving surface 3, whereas the die 4 extends to a height $h_1$ above the die receiving surface 3, where $h_2$ is larger than $h_1$ so that the encapsulant 20 covers the die receiving surface 3 and also covers the semiconductor die 4. Note that in both of the examples shown in FIGS. 4 and 7, some of the encapsulant 20 extends into the openings 9 described above in relation to FIG. 1. Accordingly, the encapsulant 20 may also serve to fix together various parts of the carrier of the packaged device, after singulation has taken place as to be described below.

Figure 8:
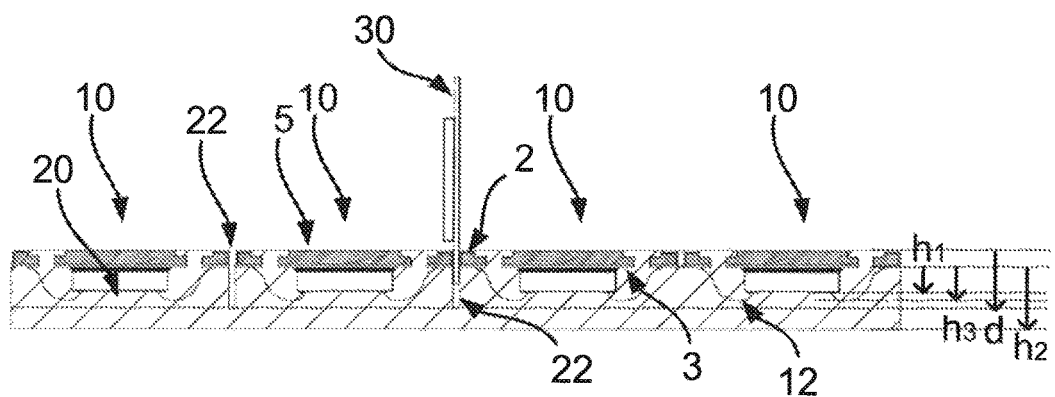
FIGS. 8 to 10 show a number of further steps in the manufacture of a plurality of packaged semiconductor devices in accordance with an embodiment of this disclosure—the steps in FIGS. 8 to 10 may be used in, for example, the manufacture of wire bonded packages (as per FIGS. 1 to 4) or flip chip packages (as per FIGS. 5 to 7).
Figure 9:
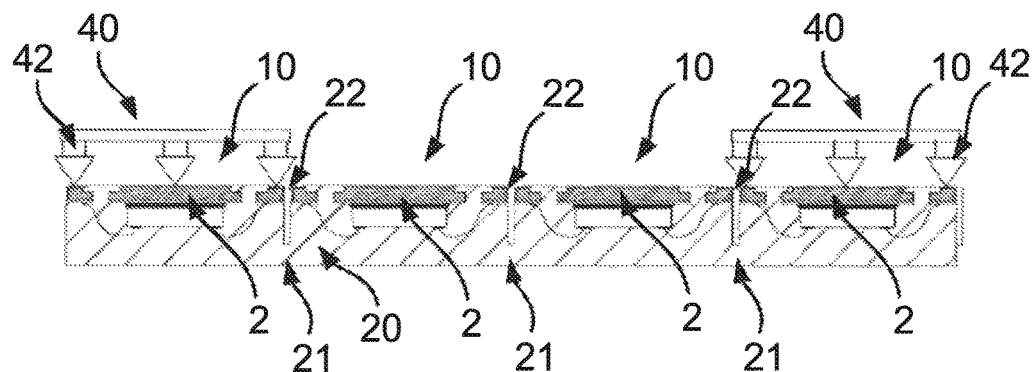
Figure 10:
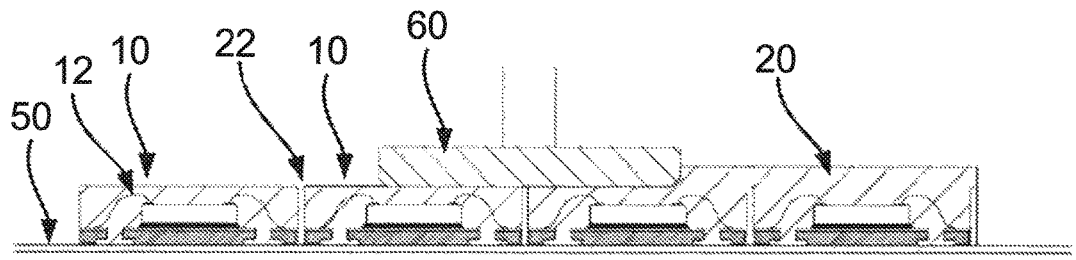

FIGS. 8 to 10 show a number of further steps in the manufacture of a plurality of packaged semiconductor devices in accordance with an embodiment of this disclosure. The embodiment of FIGS. 8 to 10 is described in relation to the manufacture of wire bonded packages (e.g. as per FIGS. 1 to 4). However, it will be appreciated that the steps in FIGS. 8 to 10 are also applicable to flip chip packages (e.g. as per FIGS. 5 to 7).

FIGS. 8 to 10 show that, following the deposition of the encapsulant 20, the carrier blank 2 and encapsulant 20 may be singulated to form a plurality of packaged semiconductor devices. In the present example, each packaged semiconductor device will include a single semiconductor die 4 mounted on a carrier, however, as noted above, it will be appreciated that more than one die 4 may be provided on each singulated carrier in each package.

It will be appreciated that the carriers of the packages may be provided in a row in the blank 2 (e.g. as per FIG. 8). However, it will also be appreciated that in some examples the carrier blank 2 may be provided as a grid of carriers to be singulated, and that the sawing of the carrier blank 2 and encapsulant 20 may occur in two dimensions (with saw lanes in the form of a grid or the like).

The singulation of the carrier blank 2 and encapsulant 20 may be carried out as a process having at least two steps. The first step is shown in FIG. 8 and the second step is shown in FIG. 10. There may be one or more intermediate steps, examples of which will be described below in relation to FIG. 9.

In the step shown in FIG. 8, the underside 5 of the carrier blank 2 is sawn into using, for example, a saw blade 30. In the present example, blade sawing is used. However, it is also envisaged that alternative methods such as plasma sawing, ablation sawing or laser sawing may be used instead.

In FIG. 8 (and also FIG. 9), the arrangement of the carrier blank 2, the encapsulant 20 and the dies and bond wires 12 is shown to be inverted for the purposes of the sawing step. This inversion is not considered to be essential.

As can be seen in FIG. 8, the saw lanes 22 extend completely through the carrier blank 2, thereby singulating the carrier blank 2 into a plurality of separate carriers. The saw lanes 22 also extend past the carrier blank 2 and into the encapsulant 20 to a depth d from the underside 5 of the carrier blank 2. As shown in FIG. 8, the depth d of each saw lane is such that the saw lanes 22 terminate at a position intermediate the height $h_1$ of the semiconductor dies 4 above the die receiving surface 3 and the height $h_2$ of the upper surface of the encapsulant 20 above the die receiving surface 3. Where bond wires 12 are used to make the connections between the semiconductor dies 4 and the carriers, the depth d of the saw lanes 22 may be such that they terminate at a position intermediate the height $h_3$ of the bond wires 12 above the die receiving surface 3 and the height $h_2$ of the encapsulant 20 above the die receiving surface 3.

Note that a depth d of each saw lane 22 is such that they do not extend completely through the encapsulant 20, but instead only extend partially towards to the upper surface of the encapsulant 20 above the die receiving surface 3.

As shown in FIG. 8, the sawing 22 separates the carriers out of the carrier blank 2. The sawing 22 may, for example, isolate the adjacent carriers in the carrier blank so that testing becomes possible. As will be described below in relation to FIG. 9, this testing may be performed prior to the final singulation of the packaged devices to be described below in relation to FIG. 10.

As can be seen in FIG. 9, after the sawing has taken place, although the carriers have been separated, each package is still held together by an intervening remaining part 21 of the encapsulant 20. Conveniently, these remaining parts 21 of the encapsulant 20 can provide mechanical stability to keep the packages in place while a number of steps may be performed prior to final singulation as to be described below in relation to FIG. 10. These steps may, for example, include the testing of each package. To perform this testing, one or more probes 40 comprising, for example, one or more probe needles 42 may be brought into contact with the underside 5 of the carriers of each package. Because the packages are held in place by the remaining parts 21 of the encapsulant 20, the locations at which the probes 40 need to be positioned in order to test a given package are predictable and stable.

In some examples, the testing may be repeated one or more times, for example, at different temperatures.

In one example, a first testing stage may be performed after the sawing of the saw lanes 22. Then, optionally, solder reflow may be performed. This may involve heating the arrangement of carriers, and their associated semiconductor dies 4 to melt any solder connections for example at the ends of the bond wires and/or involving solder balls located in between the major surface of the semiconductor die 4 and the die receiving surface 3 of each carrier, in the case of a flip chip type of package.

The above described testing steps using the probes 40 and needles 42 may then be repeated after the solder reflow step, in order to verify the connections between the semiconductor die 4 and each carrier. Note that the remaining portions 21 of the encapsulant 20 may also keep the various packages fixed together during the solder reflow process, so that when the re-testing is performed as described above, the positions at which the needles 42 of the probes 40 need to be placed remain predictable and stable.

After the optional steps described above in relation to FIG. 9 have been performed, the singulation of the packaged semiconductor devices may be completed as shown in FIG. 10. In this step, encapsulant is removed from the upper surface of the encapsulant 20, at least until the above-mentioned position (at depth d, as measured from the underside 5) of the saw lanes 22 is reached. In this way, the above-mentioned remaining parts 21 of the encapsulant 20 may be completely removed, thereby to finally separate each packaged device from its neighboring packaged devices in the array.

The removal of the encapsulant 20 from the top of the encapsulant 20 may be implemented by grinding. For example, as shown in FIG. 10, a grinding tape 50 may be attached to the underside of the carriers and then a grinding implement such as the rotatable grinder 60 shown in FIG. 10 may be used to scan across the top of the encapsulant 20, removing encapsulant 20 from the top surface to a given depth.

It is envisaged that the amount of encapsulant 20 that is removed from the top surface of the encapsulant 20 may correspond exactly to the depth d of the saw lanes 22 described above, so that no more encapsulant than is strictly necessary may be removed. However, to provide a degree of tolerance and/or to allow the overall height of the encapsulant 20 in the finished device to be chosen in accordance with design requirements, more encapsulant may be removed, so that the removal of the encapsulant 20 continues to a certain depth after the bottoms of the saw lanes 22 have been reached. In any event, the final height of the encapsulant 20 in the finished packaged semiconductor device is envisaged to be higher above the die receiving surface 3 of each carrier than the height of the semiconductor die 4, so that even after the removal of encapsulant during singulation, the semiconductor dies 4 remain covered by the encapsulant 20. Also, as shown in FIG. 10, where bond wires 12 are used, it is envisaged that the final height of the encapsulant 20 should also cover the bond wires 12.

After the removal of the encapsulant from the top surface of the encapsulant 20 as shown in FIG. 10, the grinding tape 50 may be removed. It is also envisaged that thereafter steps such as laser marking and taping and reeling may be performed. It is envisaged that the array of packaged devices may be re-taped onto a dicing tape in order to perform these steps (e.g. to avoid the need to flip each packaged die over during tape and reel). It is also envisaged that the grinding tape 50 shown in FIG. 10 may be used to implement this.

Accordingly, there has been described a method of making a plurality of packaged semiconductor devices. The method includes providing a carrier blank having a die receiving surface and an underside. The method also includes mounting a plurality of semiconductor dies on the die receiving surface, wherein the dies extend to a first height above the die receiving surface. The method further includes depositing an encapsulant on the die receiving surface, wherein an upper surface of the encapsulant is located above said first height. The method also includes singulating to form the plurality of packaged semiconductor devices by sawing into the underside, through the carrier blank and partially through the encapsulant to a depth intermediate the first height and the upper surface, wherein said sawing separates the carrier blank into a plurality of carriers, and removing encapsulant from the upper surface of the encapsulant at least until said saw depth is reached.

Although particular embodiments of this disclosure have been described, it will be appreciated that many modifications/additions and/or substitutions may be made within the scope of the claims.

The invention claimed is:

1. A method of making a plurality of packaged semiconductor devices, the method comprising:
   providing a carrier blank having a die receiving surface and an underside;
   mounting a plurality of semiconductor dies on the die receiving surface of the carrier blank,
      wherein the dies extend to a first height above the die receiving surface;
   depositing an encapsulant on the die receiving surface,
      wherein an upper surface of the encapsulant is located above said first height,
   whereby the encapsulant covers the plurality of semiconductor dies; and
   singulating the carrier blank and encapsulant to form the plurality of packaged semiconductor devices by:
      sawing into the underside of the carrier to saw through the carrier blank and
      saw partially through the encapsulant to a saw depth intermediate the first height and the upper surface of the encapsulant,
      wherein said sawing separates the carrier blank into a plurality of carriers,
      each carrier having
         an underside corresponding to the underside of the carrier blank and
         a die receiving surface corresponding to the die receiving surface of the carrier blank,
      wherein the die receiving surface of each carrier has at least one of said semiconductor dies mounted thereon; and
      removing encapsulant from upper surface of the encapsulant at least until said saw depth is reached;
   further comprising contacting an electrical probe to the underside of at least some of the carriers to test the packaged semiconductor devices; and
   performing solder reflow;
      wherein said solder reflow is performed after said testing the packaged semiconductor devices;
   further comprising contacting an electrical probe to the underside of at least some of the carriers to re-test the packaged semiconductor devices after said solder reflow is performed.

2. The method of claim 1,
   wherein said contacting an electrical probe to the underside of at least some of the carriers is performed after said sawing and before said removing encapsulant from upper surface of the encapsulant.

3. The method of claim 1,
   wherein said re-testing the packaged semiconductor devices is performed before said removing encapsulant from upper surface of the encapsulant.

4. The method of claim 1,
comprising using wire bonding electrically to connect each semiconductor die to the carrier blank prior to depositing the encapsulant on the die receiving surface.

5. The method of claim 4,
wherein after said depositing the encapsulant on the die receiving surface, the encapsulant extends to a greater height above the die receiving surface than the bond wires, so that the encapsulant covers the bond wires.

6. The method of claim 5,
wherein after said removing encapsulant from upper surface of the encapsulant, the encapsulant still extends to a greater height above the die receiving surface than the bond wires, so that the encapsulant still covers the bond wires.

7. The method of claim 1,
wherein each semiconductor die has a major surface having one or more electrical connections provided thereon, and
wherein mounting the semiconductor dies on the die receiving surface comprises attaching the major surface of each die to the die receiving surface by electrically connecting the electrical connections on the major surface of each die to the die receiving surface.

8. The method of claim 1
comprising, prior to said removing encapsulant from upper surface of the encapsulant, mounting the undersides of the carriers on a grinding tape.

9. The method of claim 1,
wherein said sawing comprises blade sawing, plasma sawing, ablation sawing, or laser sawing.

10. The method of claim 1,
wherein the carrier of each packaged semiconductor device comprises a lead frame, or a substrate comprising a dielectric body and one or more electrical contacts.

11. A method of making a plurality of packaged semiconductor devices, the method comprising:
providing a carrier blank having a die receiving surface and an underside;
mounting a plurality of semiconductor dies on the die receiving surface of the carrier blank,
wherein the dies extend to a first height above the die receiving surface;
depositing an encapsulant on the die receiving surface,
wherein an upper surface of the encapsulant is located above said first height,
whereby the encapsulant covers the plurality of semiconductor dies; and
singulating the carrier blank and encapsulant to form the plurality of packaged semiconductor devices by:
sawing into the underside of the carrier to saw through the carrier blank and
saw partially through the encapsulant to a saw depth intermediate the first height and the upper surface of the encapsulant,
wherein said sawing separates the carrier blank into a plurality of carriers,
each carrier having
an underside corresponding to the underside of the carrier blank and
a die receiving surface corresponding to the die receiving surface of the carrier blank,
wherein the die receiving surface of each carrier has at least one of said semiconductor dies mounted thereon; and
removing encapsulant from upper surface of the encapsulant at least until said saw depth is reached;
performing a solder reflow;
wherein said solder reflow is performed after a first testing of the packaged semiconductor devices;
further comprising contacting an electrical probe to the underside of at least some of the carriers to re-test the packaged semiconductor devices after said solder reflow is performed.

12. The method of claim 11,
wherein said re-testing the packaged semiconductor devices is performed before said removing encapsulant from upper surface of the encapsulant.

* * * * *